United States Patent
Gasse et al.

(10) Patent No.: US 9,622,382 B2
(45) Date of Patent: Apr. 11, 2017

(54) HEAT-SINK DEVICE INTENDED FOR AT LEAST ONE ELECTRONIC COMPONENT AND CORRESPONDING METHOD

(75) Inventors: Adrien Gasse, Grenoble (FR); Pascal Revirand, Saint-egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 329 days.

(21) Appl. No.: 13/877,752

(22) PCT Filed: Sep. 27, 2011

(86) PCT No.: PCT/IB2011/054243
§ 371 (c)(1),
(2), (4) Date: May 9, 2013

(87) PCT Pub. No.: WO2012/046161
PCT Pub. Date: Apr. 12, 2012

(65) Prior Publication Data
US 2013/0322019 A1 Dec. 5, 2013

(30) Foreign Application Priority Data
Oct. 5, 2010 (FR) ...................................... 10 03931

(51) Int. Cl.
*H05K 7/20* (2006.01)
*H01L 23/36* (2006.01)
(Continued)

(52) U.S. Cl.
CPC ........... *H05K 7/2039* (2013.01); *F21V 29/87* (2015.01); *H01L 21/4882* (2013.01); *H01L 23/367* (2013.01); *H01L 23/3672* (2013.01); *H01L 23/3737* (2013.01); *H05K 3/30* (2013.01); *F21V 29/717* (2015.01); *F21Y 2115/10* (2016.08);
(Continued)

(58) Field of Classification Search
CPC ... H05K 7/20418; H01L 23/36; H01L 23/367; H01L 23/3672; H01L 23/3675; H01L 23/3677
USPC ....... 29/890.03, 423, 460, 469, 527.1–527.4; 361/697, 703, 709–710; 257/722
See application file for complete search history.

(56) References Cited

U.S. PATENT DOCUMENTS 5,247,734 A * 9/1993 Lubbe ..................... B23P 15/26
165/80.4
5,344,795 A * 9/1994 Hashemi et al. ........ 264/272.15
(Continued)

FOREIGN PATENT DOCUMENTS

DE 200 16 316 4/2001
DE 10 2007 039904 8/2008
(Continued)

*Primary Examiner* — Adam B Dravininkas
(74) *Attorney, Agent, or Firm* — Clark & Brody

(57) ABSTRACT

A heat-sink device intended for at least one electronic component (12), includes: a heat-sink; a substrate (11) for the at least one electronic component (12), said substrate covering the heat-sink; and thermal coupling provided between the substrate and the heat-sink and made from a material different from that of the heat-sink. The heat-sink comprises of a set of independent fins (10), and the thermal-coupling (13) is made from a heat-conductive polymer material and also serve as mechanical coupling between the substrate (11) and the fins (10).

4 Claims, 3 Drawing Sheets

Figure 1:
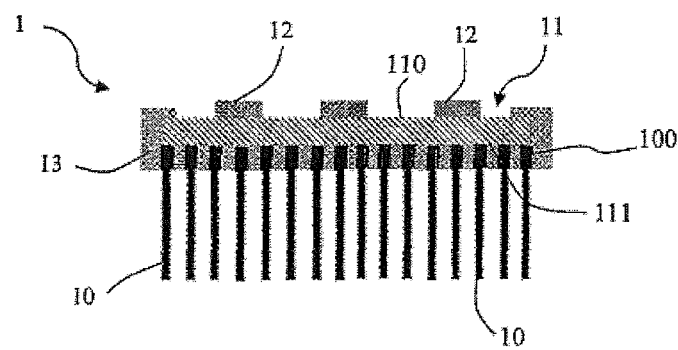

(51) Int. Cl.
    *H01L 21/48*      (2006.01)
    *H01L 23/367*     (2006.01)
    *H01L 23/373*     (2006.01)
    *H05K 3/30*       (2006.01)
    *F21V 29/87*      (2015.01)
    *F21V 29/71*      (2015.01)
    *F21Y 115/10*     (2016.01)

(52) U.S. Cl.
    CPC ... *H01L 2924/0002* (2013.01); *Y10T 29/4913* (2015.01)

(56)                References Cited

U.S. PATENT DOCUMENTS

| 5,533,257 | A  | * | 7/1996  | Romero         | H01L 21/4882 |
|           |    |   |         |                | 164/98       |
| 5,562,146 | A  | * | 10/1996 | Harmon         | B22D 19/0063 |
|           |    |   |         |                | 164/112      |
| 5,791,045 | A  | * | 8/1998  | Yamamoto et al.| 29/890.03    |
| 5,796,049 | A  | * | 8/1998  | Schneider      | H01L 23/3733 |
|           |    |   |         |                | 174/252      |
| 5,981,085 | A  | * | 11/1999 | Ninomiya       | H01L 21/4871 |
|           |    |   |         |                | 257/712      |
| 6,085,830 | A  | * | 7/2000  | Mashiko et al. | 165/80.3     |
| 6,408,935 | B1 |   | 6/2002  | Dehoff et al.  |              |
| 2002/0018338 | A1 | * | 2/2002 | McCullough  | H01L 21/4882 |
|           |    |   |         |                | 361/709      |
| 2003/0183379 | A1 | * | 10/2003 | Krassowski et al. | 165/185  |
| 2004/0037043 | A1 | * | 2/2004  | Ku          | H01L 23/4334 |
|           |    |   |         |                | 361/718      |
| 2004/0150956 | A1 | * | 8/2004  | Conte       | H01L 23/3677 |
|           |    |   |         |                | 361/709      |
| 2011/0090650 | A1 | * | 4/2011  | Oda         | 361/717      |

FOREIGN PATENT DOCUMENTS

| DE | 10 2008 005748 | 7/2009  |
| EP | 1 691 412      | 8/2006  |
| EP | 2 216 807      | 8/2010  |
| WO | 00/03574       | 1/2000  |
| WO | 2007/112226    | 10/2007 |

\* cited by examiner

HEAT-SINK DEVICE INTENDED FOR AT LEAST ONE ELECTRONIC COMPONENT AND CORRESPONDING METHOD

The invention concerns a heat-sink device for at least one electronic component, such as a light-emitting diode (LED).

It also concerns a method for obtaining such a heat-sink device.

As a general rule, most electronic components have an efficiency of less than 1. This means that some of the electrical energy fed to the component is not usable for the desired function and leads to the production of heat. This is notably the case with light-emitting diodes, for which only about 25% of the electrical energy supplied is usable and produces light, 75% of this energy therefore being converted into heat.

In the case where the electronic component is not cooled, it heats up. For light-emitting diodes, for example, this heating notably leads to a reduction of efficiency, colorimetric drift and a reduction of reliability.

This is why it is indispensible to provide for appropriate dissipation of the heat generated by the electronic components.

The electronic components are generally placed on a substrate known as a "printed circuit board" (PCB), which enables a plurality of electronic components to be interconnected. To cool the substrate and the electronic components that it carries, it is known to couple this substrate thermally to a heat-sink comprising fins assuring the dissipation of heat.

The dissipation of heat is effected by conduction, convection and radiation.

The dissipation by conduction occurs within the body of the heat-sink. The dissipation by convection and by radiation occurs at the surface of the body of the heat-sink and is proportional to the area of exchange between the body and the outside.

Accordingly, to ensure good dissipation of heat, the material constituting the heat-sink must have a high thermal conductivity (dissipation by conduction) and a large exchange area (dissipation by convection and radiation).

A heat-sink comprising cooling fins enables the exchange areas within a given volume to be increased.

Thus there may be cited the document WO 2005/001943 which describes light-emitting diodes placed on a substrate, the latter covering a heat-sink. The substrate enables transfer of heat from the diodes to the heat-sink.

In another embodiment, the substrate is connected to the heat-sink by way of a connecting layer and thermally conducting passages are formed through the substrate to allow heat to pass from the diodes to the heat-sink. This connecting layer is a thermally conductive tape or adhesive.

However, the thermal conductivity of these materials is generally mediocre, typically less than 1 W/m.K.

Moreover, the formation of passages through the substrate constitutes an additional operation that is costly to perform.

There may also be cited the document WO 2009/115512 which describes a heat-sink for an electronic component which includes a body made from a plastic material that is a conductor of heat. This heat-sink is thermally coupled to a heat source which is typically a printed circuit board carrying LEDs.

The thermal connection between the heat-sinks and the printed circuit board is either direct or by way of an insulator, for example a layer of a material that is a conductor of heat and an electrical insulator.

Moreover, the shape of the heat-sink influences the efficacy of the heat dissipation.

Accordingly, reducing the thickness of the fins and the spacing between the fins enables the number of fins in a given volume to be increased. However, the reduction of the thickness of the fins leads to an increase in the internal thermal resistance to conduction.

A compromise must therefore be found between the thickness of the fins and the thermal conductivity of the material constituting them.

This is why the heat-sinks are often made from materials of high thermal conductivity, such as aluminum, for example. Thus fins made of aluminum may have a much smaller thickness than fins made from steel.

Moreover, obtaining fins of small thickness having a small spacing between them necessitates the use of precision mechanical machining techniques that are costly. This is further accentuated if the shape of the fins is complex, for example curved with a specific geometrical shape.

This is why to produce heat-sinks with fins of complex shapes it is possible to use metal foundry techniques.

However, these techniques do not enable very small thicknesses to be obtained, the minimum thickness of a fin typically being 2 mm.

Moreover, these foundry techniques necessitate melting of the metal at a temperature higher than its melting point. They therefore consume a large amount of energy.

An object of the invention is therefore to alleviate these drawbacks by proposing a heat-sink device intended for at least one electronic component, this device offering a large exchange area within a given volume, thanks to a small thickness of fins, this device being obtained at low cost and being able to feature fins of complex shape.

The invention therefore concerns such a device including:
heat-sink means,
a substrate for said at least one electronic component, covering said heat-sink means, and
thermal coupling means between the substrate and the heat-sink means, these coupling means being made from a material different from the material constituting the heat-sink means, in which device the heat-sink means consist of a set of independent fins and the thermal coupling means are made from a heat-conductive polymer material and also provide the mechanical coupling between said substrate and said fins.

In one embodiment, the device includes, opposite said substrate, another substrate carrying at least one electronic component and other coupling means, thanks to which said other substrate is also thermally and mechanically coupled to said fins.

The material constituting the thermal coupling means is preferably a thermoplastic polymer.

Furthermore, the material constituting the thermal coupling means may include a thermally conductive filler and the coupling means advantageously have a thermal conductivity greater than 1 W/m.K.

The coupling means preferably coat at least a part of the fins and are preferably in direct contact with the substrate.

The thickness of the fins is advantageously between 250 µm and 2.5 mm.

The fins are preferably produced in a material the thermal conductivity of which is greater than 20 W/m.K.

The invention also concerns a method for obtaining a heat-sink device intended for at least one electronic component, this method including the following steps:
(a) a discrete set of fins is obtained,
(b) the fins are positioned and held, the fins defining between them a particular gap, (c) an assembly formed of a substrate and at least one electronic component is obtained, (d) said assembly is positioned on the edges of the fins, said substrate being in at least partial contact with said fins, (e) a heat conductive material is molded between said substrate and said fins:

A variant of this method includes the following steps between the steps (c) and (d):

($c_1$) a part is inserted over the free edges of the fins, ($c_2$) a sacrificial material is molded between said part and said support, and ($c_3$) said part is then removed, in which method the sacrificial material is removed after the step.

The support of the fins is preferably removed after the step (e) or the step ($c_3$).

In another variant of the method the following steps are carried out after the step (e):

(f) another assembly is obtained formed of a substrate and at least one electronic component, (g) said other assembly is positioned on the free edges of the fins opposite said assembly, (h) a heat conductive material is molded between said other substrate and said fins.

The material used during the steps (e) and/or (h) is preferably a polymer material injected at raised temperature, the method then including a cooling step after the steps (e) and/or (h).

Figure 2:
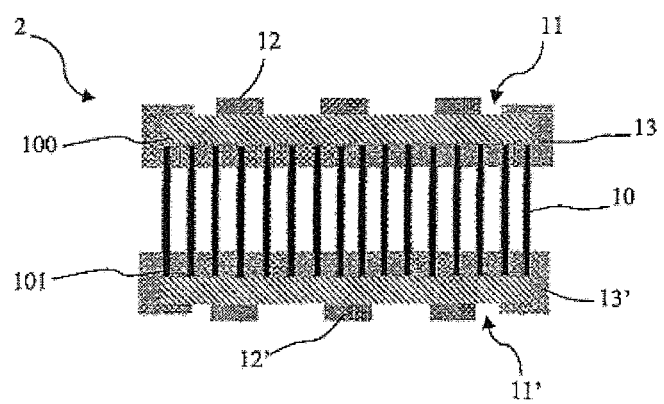
Figure 3:
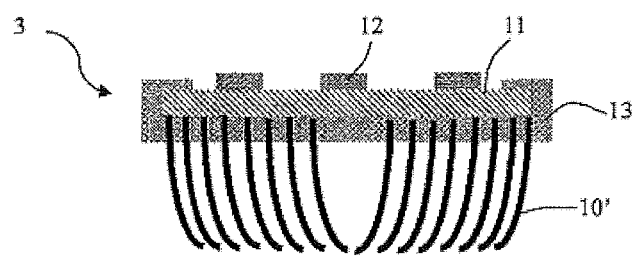
Figure 4A:
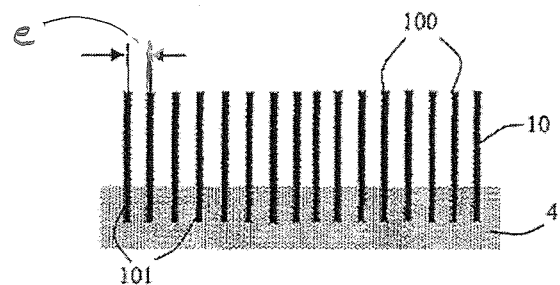
Figure 4B:
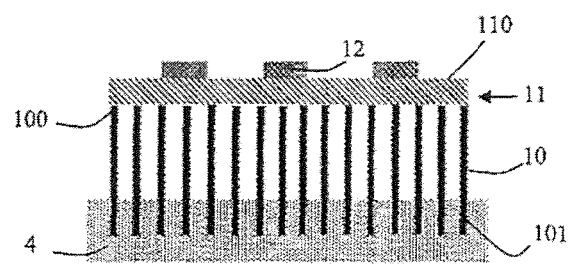
Figure 4C:
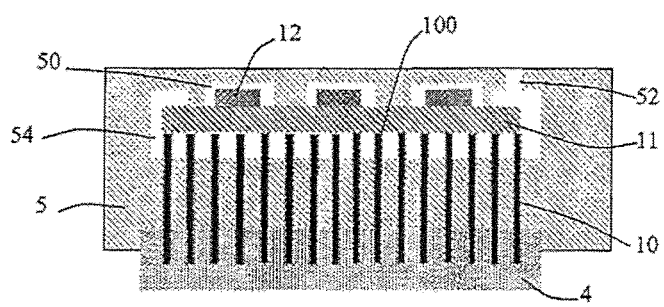
Figure 6:
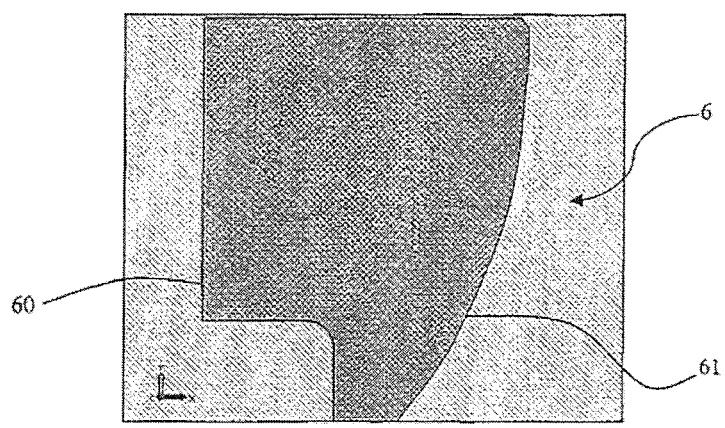

The invention will be better understood and other objects, advantages and features thereof will become more clearly apparent in the course of the following description with reference to the appended drawings, in which:

FIG. 1 is a view in section of a first example of a heat-sink according to the invention, FIG. 2 represents a second example of a heat-sink according to the invention, FIG. 3 shows a third example of a heat-sink according to the invention, FIGS. 4a to 4c show steps of a method for obtaining a heat-sink according to the invention, FIGS. 5a to 5d show additional steps of a variant of the method for obtaining a heat-sink according to the invention, and FIG. 6 is a top view of a fin of a heat-sink that may be obtained by the method described with reference to FIGS. 5a to 5d.

Elements common to the various figures will be designated by the same references.

The heat-sink device 1 shown in FIG. 1 includes a discrete set of fins 10, here sixteen plane fins disposed substantially parallel to each other.

As will be explained in the remainder of the description, the fins may have any shape, whether plane or circular, like solid cylinders.

These fins constitute the heat-sink means and are produced in a material having good thermal conductivity, typically greater than 20 W/m.K, or even greater than 50 W/m.K.

These materials may notably be chosen from an alloy based on aluminum or copper or steel.

More costly materials may equally be used, such as ceramic materials for example of the graphite, silicon carbide or aluminum nitride type, or composite materials of the Al/SiC, C/C or W/Cu type.

The device 1 also includes a substrate 11 on which are placed electronic components 12.

The substrate 11 may be a single-layer or a multi-layer substrate.

This substrate may be a PCB (printed circuit board), based on a polymer, for example, notably of the FR4 type, i.e. an epoxy resin composite material reinforced with glass fibers.

The substrate may equally be of the MCPCB (metal core PCB) type, i.e. include a thick metal layer, produced in Al or Cu for example, on which is formed a thin layer of a polymer material, for example of the FR4 type, a thin metal layer being also formed on the polymer layer.

The substrate may equally be of the IMS (insulated metal substrate) type. This substrate has a configuration close to that of the MCPCB. However, the insulative material coating the metal core is not an FR4 type polymer but another polymer having good thermal conduction properties or alumina obtained for example by oxidation of aluminum.

The substrate may equally be based on a ceramic material, notably alumina and aluminum nitride.

The substrate may further be made from a flexible material, typically from a polymer of the polyimide type.

The substrate 11 includes, on its face 110 receiving the electronic components, a layer of metal, for example of copper, thanks to which the substrate provides the electrical interconnection between the components 12 and a spreading of heat proportional to the thickness of copper.

The thickness of the copper layer is typically 35 μm.

The substrate 11 also provides within its thickness spreading of the heat coming from the various components 12. This is why its thickness is typically at least 350 μm.

However, in some cases, for example the use of a polyimide-based substrate, the thickness of the substrate is relatively small, typically between 25-100 μm. The spreading of the heat is obtained essentially thanks to the metal interconnection layer.

As a general rule, the spreading of the heat increases with the thickness of the metal layer.

In this regard, an MCPCB type substrate is advantageously used because it includes a thick metal layer on the face 111 opposite the face 110.

Finally, the substrate 11 may include thermal vias to encourage the dissipation of heat, as described for example in the document WO 2005/001943.

The electronic components 12 considered are electronic components that produce heat. These are typically components of LED type or power integrated circuits such as microprocessors, insulated gate bipolar transistors (IGBT) or high electron mobility transistors (HEMT).

In the conventional way, the electronic components 12 are soldered or glued to the substrate 11. A glue having good thermal conduction properties may typically be used such as epoxy glues charged with particles of silver.

Other techniques based on thermal paste may equally be used. However, they lead to a transfer of heat between the electronic components and the substrate that is of lower level.

As FIG. 1 shows, the face 111 of the substrate 11 is at least partly in contact with the edge 100 of the fins 10 and a layer 13 is provided between the substrate and the upper part of the fins near their edge 100.

This layer 13 ensures both the mechanical coupling and the thermal coupling between the fins 10 and the substrate 11. This layer is continuous.

The coupling means 13 are produced in a polymer material, preferably one that can be injected under pressure.

It may be a thermoplastic polymer, chosen for example from the following polymers: polypropylene, polyamide, polystyrene, polyethylene, polypropylenestyrene, polymethylmethacrylate, polycarbonate, acrylonitrile-butadiene-styrene copolymer or a liquid crystal polymer.

A thermoplastic polymer has the advantage that it can be injected at raised temperature because it is soft when it is heated above a particular temperature. Its shape can then be fixed by cooling. Finally, this operation is reversible.

Thermosetting polymer materials may also be used, notably ones based on epoxy or silicone.

To improve the thermal conductivity of the polymer, a thermally conductive filler, for example a mineral filler such as graphite, or carbon black, may advantageously be introduced into the polymer.

The thermal conductivity obtained is typically between 1 and 20 W/m.K.

The heat-sink 2 shown in FIG. 2 differs from that shown in FIG. 1 in that it includes another substrate 11' positioned on the edges 101 of the fins 10, opposite the edges 100, this substrate supporting electronic components 12'.

Means 13', similar to the means 13, provide the thermal and mechanical coupling between the fins 10 and the substrate 11'.

The heat-sink 3 shown in FIG. 3 differs from the heat-sink shown in FIG. 1 in that the fins 10' are of curved shape.

Moreover, this heat-sink 3 also includes a substrate 11 on which are placed electronic components 12 and means 13 for mechanical and thermal coupling between the fins 10' and the substrate 11.

The examples of heat-sinks that have just been described show that the invention enables production of heat-sinks having fins of any shape.

Accordingly, fins of plane shape could be obtained by mechanical cutting of a metal sheet by laser machining, wire saw, electro-erosion, cutting or punching techniques.

These techniques enable a large number of fins to be produced in a single sheet of large size.

For fins of complex shape, for example of curved shape as shown in FIG. 3, a pressing step may be provided after the cutting of the fins to give them a curved shape.

In all cases, the techniques employed are techniques of low production cost.

Moreover, the thickness of the fins is typically between 250 μm and 2.5 mm. Their thickness depends only on the thickness of the sheet that is used. Accordingly, obtaining fins with a thickness less than 1 mm does not necessitate the use of precision machining techniques.

It is therefore possible to increase the exchange area for a heat-sink of given volume without increasing its fabrication cost. This constitutes an important advantage in relation to known prior art heat-sinks. Moreover, the method is particularly suitable for the production of fins in a material having a high thermal conductivity, such as aluminum.

A method for obtaining a heat-sink such as that shown in FIG. 1 will now be described with reference to FIGS. 4a to 4c.

This method consists first of all in producing a set of fins by one of the techniques that have just been described.

By way of example, these fins are of rectangular shape, with a width of 30 mm and a height of 20 mm.

They have been obtained by laser or electro-erosion type machining from a 1050 grade aluminum sheet with a thickness of 1 mm.

FIG. 4a shows that these fins 10 are first placed in a positioning means 4, for example made of steel, via their edge 101.

This means 4 is designed to position and hold the fins. The latter are substantially parallel to each other and are separated from each other by a particular gap "e", for example of 1 mm.

The method consists equally in obtaining an assembly formed of a substrate 11 and at least one electronic component 12.

These electronic components are light-emitting diodes for example which are attached to the face 110 of a standard PCB type substrate by soldering them.

This substrate is made from a composite material of the epoxy/glass fiber type the thickness of which is 1 mm, for example. On this same face 110 of the substrate there is disposed a copper layer 35 μm thick.

FIG. 4b shows the assembly formed in this way, after it is positioned on the fins 10.

A substrate having a length of 31 mm and a width of 30 mm can thus cover the sixteen fins 10 previously described.

The substrate is therefore in contact with the edges 100 of the fins opposite the edges 101 that are placed in the support 4.

In this regard, it should be noted that the contact between the substrate 11 and the fins 10 is not necessarily perfect. Indeed, for cutting tolerance reasons, the fins 10 do not necessarily have strictly the same height.

This does not constitute a drawback either for the implementation of the method or for the device that will be obtained.

FIG. 4c shows an injection mold 5. It may be made in one piece but is generally constituted of a plurality of parts, however.

Its shape is adapted to that of the parts described with reference to FIG. 4b and notably enables the injection of material around the components 12 to be avoided, thanks to the presence of cavities 50 for protecting these components.

This mold 5 also includes a cavity 54 in which are placed the substrate 11 and a portion of the fins 10 situated in the vicinity of the edges 100.

As a general rule, the cavity 51 will be sufficiently large to accept about 10% of the height of the fin.

The mold 5 may notably be made of steel. It may include removable inserts, disposed for example between the fins and contained in an exterior shell.

Of course, this mold must be thermally controlled. To this end, it may include internal channels in which a fluid is intended to circulate in order to maintain a constant temperature.

The cavity 51 includes a feed hole 52 through which the material will be introduced into the mold.

The thermally conductive material is injected under pressure into the mold 5.

It should be noted that the injection of conductive polymer in direct contact with the fins and the substrate enables the internal thermal resistance of the system to be reduced.

Moreover, if the contact between the edge of the fins and the substrate were not perfect, polymer material will also be present between the edge of the fins and the substrate. This does not interfere with the operation of the device.

This material is preferably a thermoplastic material which is injected at raised temperature.

It may notably be a polymer distributed by the company Coolpolymers under the reference E 4501. This polymer has a thermal conductivity of 4 W/m.K. The injection temperature is 200° C. and the temperature of the mold is maintained at 50° C.

After cooling, the various parts of the mold 5 and the support 4 for the fins are removed. Moreover, the polymer that remains present in the support 11 because of the feed hole is eliminated mechanically to obtain the heat-sink shown in FIG. 1.

Accordingly, the device includes fins part of the height of which, in the vicinity of their edge 100, is coated with a thermally conductive material. This part typically corresponds to 10% of the height of the fins. As a general rule, the lower the conductivity of the thermally conductive polymer material the greater the height of the fin that it coats, so as to increase the overall conductance of the fin.

A variant of the method of the invention will now be described with reference to FIGS. 5a to 5d.

This variant is used if the heat-sink has a very complex shape and it is consequently difficult to design a conform mold that is easily demountable after the injection operations.

This is notably the case when the fins have a shape such as shown in FIG. 6, with an edge 61 of circular arc shape facing a straight edge 60.

These fins are then disposed radially on a central support.

To simplify the diagrams illustrating the various steps of the method, the latter method will be described for a heat-sink similar to that shown in FIG. 1.

The method then consists in first producing a set of fins, which fins can have a complex shape, as shown in FIG. 6.

The techniques and the materials described above may be used.

The fins 10 are first placed in a positioning means 4, made of steel, for example.

Figure 5A:
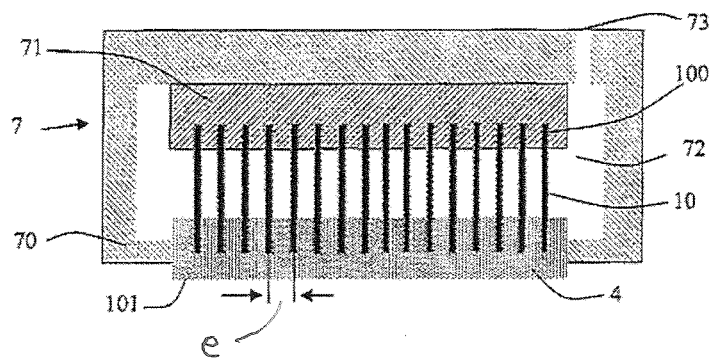

In the example shown in FIG. 5a, the positioning of the fins is effected by way of their edge 101. For fins 6 such as those shown in FIG. 6, their positioning on a radial means would be effected by way of their edge 60.

In the example shown in FIG. 5a, the fins are separated from each other by a gap "e" of 1 mm, for example.

FIG. 5a shows a mold 7 which includes an external part 70 that may be made in a number of parts and a removable central insert 71.

The insert is disposed on the edges 100 of the fins 10, so as to surround the fins 10 over a part of their height. The assembly constituted by the means 4, the fins 10 and the insert 71 is then placed in the interior of the part 70 of the mold.

The method then consists in injecting a sacrificial material into the cavity 72 of the part 70 via the feed hole 73.

This sacrificial material is polystyrene, for example. The temperature of injection of this material is 220° C., for example, the temperature of the mold being maintained at 50° C.

Figure 5B:
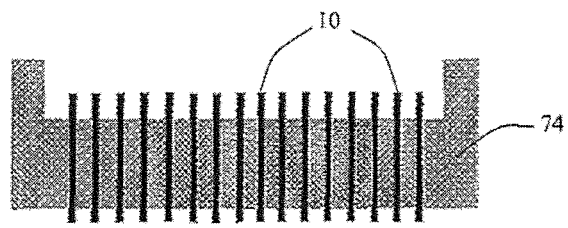
Figure 5C:
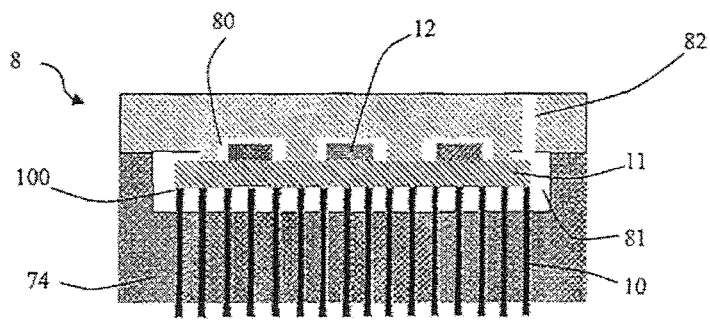
Figure 5D:
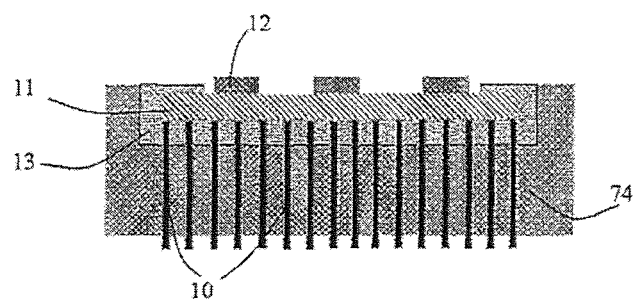

FIG. 5b shows the fins 10 and the sacrificial material 74 after removal of the tool 4 and the mold 7. Moreover, the sacrificial material present because of the feed hole 73 has been eliminated mechanically.

A substrate 10 supporting electronic components 12 is produced. Reference may notably be made to the foregoing description for the obtaining of this substrate.

When the fins are disposed radially, the substrate has the shape of a ring.

It may consist of an MCPCB type substrate formed of a layer of copper 1 mm thick, a layer of a dielectric material, typically FR4, 75 μm thick, and a layer of copper providing an interconnection between the electronic components, typically 35 μm thick.

The substrate obtained in this way is positioned on the edges 100 of the fins.

Another mold 8 is then positioned on the substrate and the sacrificial material 74.

This mold 8 includes cavities 80 into which the components 12 are inserted and which enable them to be protected during the subsequent step.

This latter step consists in injecting a thermally conductive material into the interior of the cavity 81 of the mold via the feed hole 82.

This material may be a conductive thermoplastic polymer, notably a polymer based on polypropylene distributed by the company Coolpolymers under the reference E 1201. This material has a thermal conductivity of 10 W/m.K. The injection temperature is then 250° C., the temperature of the mold being 70° C.

After cooling, the mold 8 is removed. Moreover, the polymer that remains present on the sacrificial material 74 because of the feed hole 82 is eliminated mechanically to obtain the element shown in FIG. 5d.

The heat-sink as shown in FIG. 1 is then obtained after a step of dissolving the sacrificial material.

During this elimination step, a protection cap is applied to the substrate 11 in order to protect the components 12.

Of course, this dissolving must be selective, i.e. the conductive material 13 must not be eliminated along with the sacrificial material 74.

This dissolving step may be carried out with a toluene type solvent, for example, as a conductive polymer based on polypropylene will not dissolve in such a solvent.

Accordingly, the method of the invention utilizes a step of injection of polymers under pressure.

It should be noted that this injection may be suitable for different conductive polymers, depending on the temperature and heat dissipation specifications.

5

This injection is carried out at a relative low temperature, generally less than 200° C. or 350° C. for materials of the liquid crystal polymer type. In all cases, the temperature is much lower than the melting point of a metal alloy, which is about 600° C. for an aluminum alloy, for example.

This injection step therefore causes less thermal stresses and does so at a low production cost. Indeed, the materials described above are of low cost compared to metals such as aluminum, for example.

Moreover, the use of a polymer injected under pressure avoids the etching operations that are conventionally carried out to obtain grooves intended to receive the fins. Moreover, this enables heat-sinks of complex shape to be obtained. Accordingly, the method of the invention enables at one and the same time production of fins of complex shape but also of a heat-sink of complex shape, by a specific assembly of these fins.

It should further be noted that the injection time is very short, typically a few seconds. Accordingly, the method of the invention enables high productivity.

The invention may notably be used to manufacture a lighting module with an integrated heat-sink, intended to be used in a light-emitting diode replacement lamp or for the manufacture of a power module intended for an electric vehicle including power transistors with a heat-sink.

The reference symbols inserted after the technical features appearing in the claims are intended only to facilitate understanding the claims and should not be taken as limiting their scope.

The invention claimed is:

1. A method for obtaining a heat-sink device, said heat-sink device being intended for at least one electronic component (12) and including:
   heat-sink means,
   a substrate (11) for said at least one electronic component (12), covering said heat-sink means, and thermal coupling means between the substrate and the heat-sink means and made from a material different from that of the heat-sink means, wherein, the heat-sink means consist of a set of discrete fins (10, 10') and the thermal coupling means (13) are made from a heat-conductive polymer and also provide a mechanical coupling between said substrate (11) and said fins (10), said method including the following steps:

(a) the discrete set of fins (10) is obtained, (b) the fins are positioned and held, the fins defining between them a particular gap "e", (c) an assembly formed of the substrate (11) and the at least one electronic component (12) is obtained, (c1) a part (71) is inserted over the free edges (100) of the fins (10), (c2) a sacrificial material (74) is molded between the part (71) and a support (4), and (c3) said part is then removed, (d) said assembly is positioned on the edges (100) of the fins (10), said substrate (11) being in at least partial contact with said fins, (e) the heat conductive material (13) is molded between said substrate and said fins, and in which method the sacrificial material (74) is removed after step (e).

2. The method claimed in claim 1, in which a support (4) of the fins (10) is removed after the step (e) or the step ($c_3$).

3. The method claimed in claim 1, in which the following steps are carried out after the step (e):

(f) another assembly formed of a substrate (11') and at least one electronic component (12') is obtained, (g) said other assembly (11', 12') is positioned on the free edges (101) of the fins (10) opposite said assembly (11, 12), (h) a heat conductive material (13') is molded between said other substrate (11') and said fins (10).

4. The method claimed in claim 1, in which the material used during the steps (e) and/or (h) is a polymer material injected at raised temperature, the method then including a cooling step after the steps (e) and/or (h).

* * * * *